(12) United States Patent
Park

(10) Patent No.: US 11,670,371 B2
(45) Date of Patent: Jun. 6, 2023

(54) SEMICONDUCTOR MEMORY DEVICE AND METHOD OF OPERATING THE SAME

(71) Applicant: SK hynix Inc., Gyeonggi-do (KR)

(72) Inventor: Jin Su Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 43 days.

(21) Appl. No.: 17/357,102

(22) Filed: Jun. 24, 2021

(65) Prior Publication Data

US 2022/0189554 A1 Jun. 16, 2022

(30) Foreign Application Priority Data

Dec. 16, 2020 (KR) .......................... 10-2020-0176739

(51) Int. Cl.

| G11C 16/04 | (2006.01) |
|---|---|
| G11C 16/08 | (2006.01) |
| G11C 16/30 | (2006.01) |
| G11C 5/06 | (2006.01) |
| G11C 16/26 | (2006.01) |
| G11C 16/10 | (2006.01) |

(52) U.S. Cl.
CPC ................ *G11C 16/08* (2013.01); *G11C 5/06* (2013.01); *G11C 16/102* (2013.01); *G11C 16/26* (2013.01); *G11C 16/30* (2013.01)

(58) Field of Classification Search
CPC .......... G11C 16/08; G11C 5/06; G11C 16/102; G11C 16/26; G11C 16/30
See application file for complete search history.

(56) References Cited

U.S. PATENT DOCUMENTS

| 2009/0225600 A1* | 9/2009 | Park ..................... G11C 11/5628 365/185.11 |
|---|---|---|
| 2018/0182461 A1* | 6/2018 | Lee .......................... G11C 8/08 |
| 2018/0350440 A1* | 12/2018 | Jang .................... G11C 16/3459 |

FOREIGN PATENT DOCUMENTS

| KR | 10-2006-0104834 A | 10/2006 |
|---|---|---|
| KR | 10-2018-0099015 A | 9/2018 |

\* cited by examiner

*Primary Examiner* — Pho M Luu
(74) *Attorney, Agent, or Firm* — IP & T Group LLP

(57) ABSTRACT

The semiconductor memory device includes a memory block including a plurality of memory strings, a pass circuit connected between local word lines of the memory block and global word lines and configured to connect the local word lines to the global word lines in response to a block selection signal, and a voltage providing circuit configured to generate an operation voltage during a program or read operation, apply the operation voltage to the global word lines, and discharge the global word lines when the program operation or the read operation is completed, and the pass circuit is configured to control the local word lines to be in a floating state after the program operation or the read operation is completed and before discharging the global word lines.

13 Claims, 7 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0176739 filed on Dec. 16, 2020, and which is incorporated herein by reference in its entirety.

BACKGROUND

Field of Invention

The present disclosure relates to an electronic device, and more particularly, to a semiconductor memory device and a method of operating the same.

Description of Related Art

Among semiconductor devices, a semiconductor memory device is largely classified into a volatile memory device and a nonvolatile memory device.

A write speed and a read speed of the nonvolatile memory device are relatively slow, however, the nonvolatile memory device maintains stored data even though power supply is cut off. Therefore, the nonvolatile memory device is used to store data to be maintained regardless of power supply. A nonvolatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is classified into a NOR type and a NAND type.

The flash memory has an advantage of a RAM which is free to program and erase data and an advantage of a ROM which may preserve stored data even though the power supply is cut off. The flash memory is widely used as a storage medium of a portable electronic device such as a digital camera, a personal digital assistant (PDA), and an MP3 player.

SUMMARY

An embodiment of the present disclosure provides a semiconductor memory device capable of preventing a channel of a discharge operation memory block of a global word line of a semiconductor memory device from boosting to a negative potential, and a method of operating the same.

According to an embodiment of the present disclosure, a semiconductor memory device includes a memory block including a plurality of memory strings, a pass circuit connected between local word lines of the memory block and global word lines and configured to connect the local word lines to the global word lines in response to a block selection signal, and a voltage providing circuit configured to generate an operation voltage during a program or read operation, apply the operation voltage to the global word lines, and discharge the global word lines when the program operation or the read operation is completed, and the pass circuit is configured to control the local word lines to be in a floating state after the program operation or the read operation is completed and before discharging the global word lines.

According to an embodiment of the present disclosure, a method of operating a semiconductor memory device includes electrically connecting local word lines of the memory block to global word lines, applying an operation voltage to the global word lines and transmitting the operation voltage to the local word lines, controlling the local word lines to be in a floating state by electrically blocking the global word lines from the local word lines, and discharging the global word lines after the local word lines are controlled to be in the floating state.

According to an embodiment of the present disclosure, a method of operating a semiconductor memory device includes electrically connecting local word lines of the memory block to global word lines, applying a read voltage to a selected local word line among the local word lines through a selected global word line among the global word lines, and applying a pass voltage to unselected local word lines through unselected global word lines, floating the local word lines by disconnecting the local word lines from the global word lines, and discharging the global word lines.

According to the present technology, a phenomenon in which a channel of a memory block is boosted to a negative potential may be prevented, by discharging the global word lines after controlling the local word lines to be in the floating state by deactivating the pass circuit that controls the connection between the global word lines and the local word lines during an operation of the semiconductor memory device.

DETAILED DESCRIPTION

Specific structural or functional descriptions of embodiments according to the concept which are disclosed in the present specification are illustrated only to describe the embodiments according to the concept of the present disclosure. The embodiments according to the concept of the present disclosure may be carried out in various forms and are not limited to the embodiments described in the present specification.

Hereinafter, embodiments of the present disclosure are described in detail with reference to the accompanying drawings, so that those skilled in the art to which the present disclosure pertains may easily carry out the technical spirit of the present disclosure.

Figure 1:
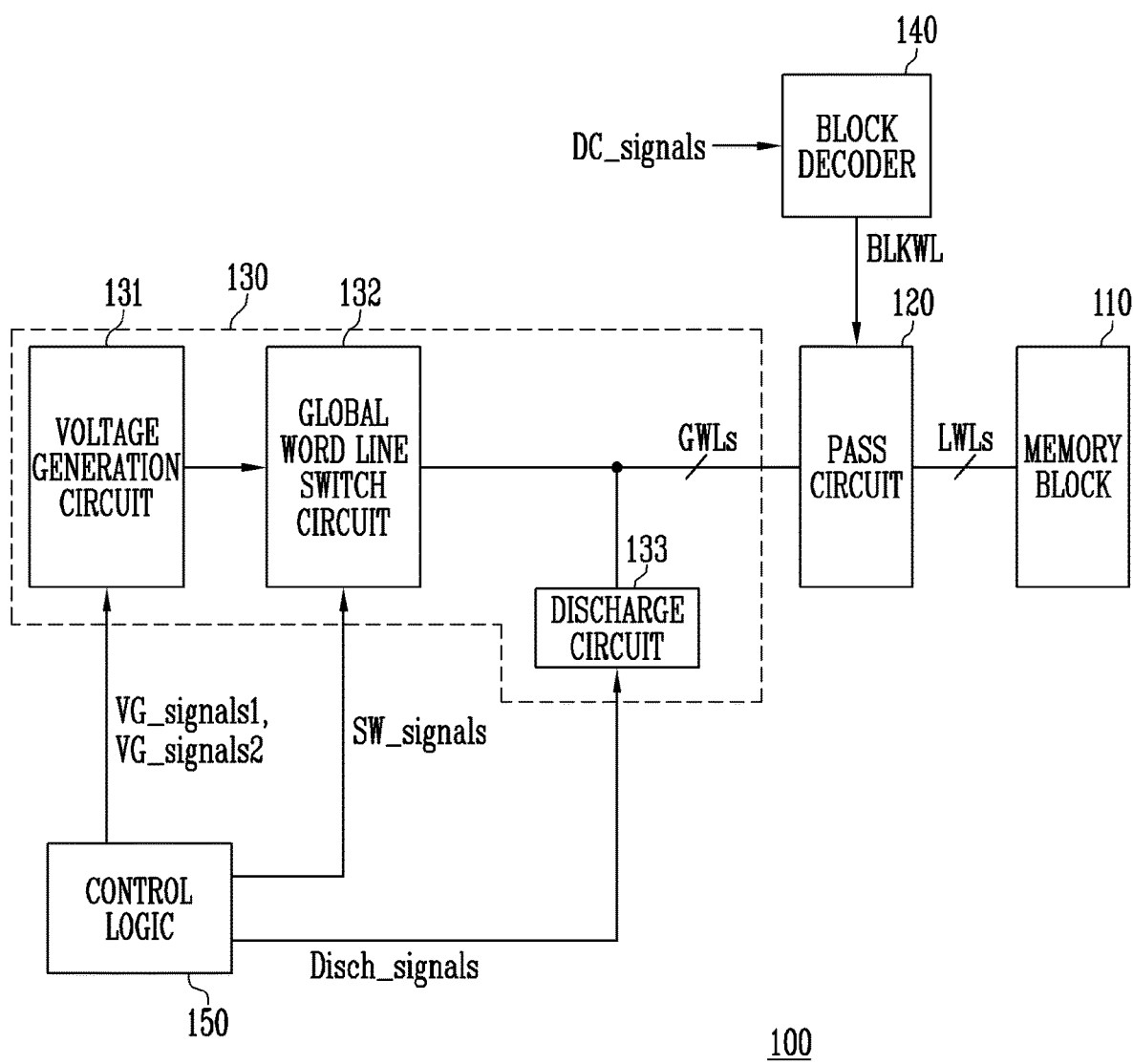
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory block 110, a pass circuit 120, a voltage providing circuit 130, a block decoder 140, and a control logic 150.

The memory block 110 may include a plurality of memory strings, and each of the plurality of memory strings may include a plurality of memory cells connected in series. In an embodiment, the plurality of memory cells may be nonvolatile memory cells, and may be configured of nonvolatile memory cells having a vertical channel structure. The memory block 110 may be configured as a memory cell array having a two-dimensional structure. According to an embodiment, the memory block 110 may be configured as a memory cell array having a three-dimensional structure. Each of the plurality of memory cells may store at least one bit of data. In an embodiment, each of the plurality of memory cells included in the memory block 110 may be a single-level cell (SLC) that stores one bit of data. In another embodiment, each of the plurality of memory cells included in the memory block 110 may be a multi-level cell (MLC) that stores two bits of data. In still another embodiment, each of the plurality of memory cells included in the memory block 110 may be a triple-level cell (TLC) that stores three bits of data. In further still another embodiment, each of the plurality of memory cells included in the memory block 110 may be a quad-level cell (QLC) that stores four bits of data. According to an embodiment, the memory block 110 may include a plurality of memory cells each storing five or more bits of data. A detailed description of a configuration of the memory block 110 is described later.

The pass circuit 120 is connected between global word lines GWLs and local word lines LWLs of the memory block 110. The pass circuit 120 electrically connects the global word lines GWLs to the local word lines LWLs in response to a block word line signal BLKWL. For example, the pass circuit 120 may transmit, to the local word lines LWLs, operation voltages transmitted through the global word lines GWLs in response to the block word line signal BLKWL during an overall operation of the semiconductor memory device 100, for example, a program operation or a read operation. In addition, the pass circuit 120 may be deactivated in response to the block word line signal BLKWL to float the local word lines LWLs of the memory block 110 before discharging a potential of the global word lines GWLs, after the program operation or the read operation of the semiconductor memory device 100 is completed. Accordingly, a phenomenon in which a channel of the memory strings included in the memory block 110 is boosted to a negative level when the potential of the global word lines GWLs are discharged may be prevented.

The voltage providing circuit 130 includes a voltage generation circuit 131, a global word line switch circuit 132, and a discharge circuit 133.

The voltage generation circuit 131 generates a plurality of operation voltages used during the overall operation of the semiconductor memory device 100 in response to first and second voltage generation control signals VG_signals1 and VG_signals2.

For example, the voltage generation circuit 131 generates a turn-on voltage to be applied to a drain select line and a source select line among the local word lines LWLs of a selected memory block in response to the first control signals VG_signals1. The voltage generation circuit 131 generates a program voltage to be applied to a selected word line among the local word lines LWLs of the selected memory block and a pass voltage to be applied to unselected word lines in response to the second control signals VG_signals2, during the program operation of the semiconductor memory device 100. In addition, the voltage generation circuit 131 generates a turn-on voltage to be applied to the drain select line and the source select line among the local word lines LWLs of the selected memory block in response to the first control signals VG_signals1. The voltage generation circuit 131 generates a read voltage to be applied to the selected word line among the local word lines LWLs of the selected memory block and the pass voltage to be applied to the unselected word lines in response to the second control signals VG_signals2, during the read operation of the semiconductor memory device 100.

The global word line switch circuit 132 switches and transmits the operation voltages to be applied to the selected memory block to the global word lines GWLs in response to switching control signals SW_signals. The operation voltages may be generated by the voltage generation circuit 131.

The discharge circuit 133 discharges the potential of the global word lines GWLs to a ground level after the overall operation of the semiconductor memory device 100 is completed. For example, when the program operation or the read operation of the semiconductor memory device 100 is completed, the discharge circuit 133 discharges the potential of the global word lines GWLs to the ground level in response to a discharge signal Disch_signals after the global word lines GWLs and the local word lines LWLs of the memory block 110 are electrically disconnected from each other by the above-described pass circuit 120 and thus the local word lines LWLs are controlled to be in a floating state.

The block decoder 140 generates a block selection signal BLKWL in response to a decoder control signal DC_signals. For example, the block decoder 140 generates and outputs, when the memory block 110 is a selected memory block, the block selection signal BLKWL having a high potential in response to the decoder control signal DC_signals, and the block decoder 140 deactivates, when the memory block 110 is an unselected memory block, the block selection signal BLKWL in response to the decoder control signal DC_signals. The block selection signal BLKWL having the high potential may activate the pass circuit 120 to electrically connect the global word lines GWLs to the local word lines LWLs of the memory block 110. The deactivated block selection signal BLKWL may deactivate the pass circuit 120 to electrically disconnect the global word lines GWLs from the local word lines LWLs of the memory block 110.

The control logic 150 controls the voltage providing circuit 130 and the block decoder 140 during the overall operation of the semiconductor memory device 100. For example, the control logic 150 may generate and output the first voltage generation control signals VG_signals1 and the second voltage generation control signals VG_signals2 for controlling the voltage generation circuit 131 to generate the operation voltage to be applied to the global word lines GWLs. For example, the control logic 150 may generate and output the switching control signals SW_signals for controlling the global word line switch circuit 132 to switch the operation voltage generated by the voltage generation circuit 131 to the global word lines GWLs. For example, the control logic 150 may generate and output the discharge signal Disch_signals for controlling the discharge circuit 133 to discharge the global word lines GWLs. In addition, the control logic 150 may generate and output the decoder signal DC_signals for controlling the block decoder 140.

In the above-described embodiment of the present disclosure, one memory block is shown and described, but the semiconductor memory device 100 may include a plurality of memory blocks. When the semiconductor memory device 100 includes the plurality of memory blocks, the semiconductor memory device 100 may further include a plurality of pass circuits and a plurality of block decoders corresponding to each of the plurality of memory blocks.

For example, one memory block may correspond to one pass circuit 120 and one block decoder, but it is not limited thereto, and at least two memory blocks may share one block decoder.

Figure 2:
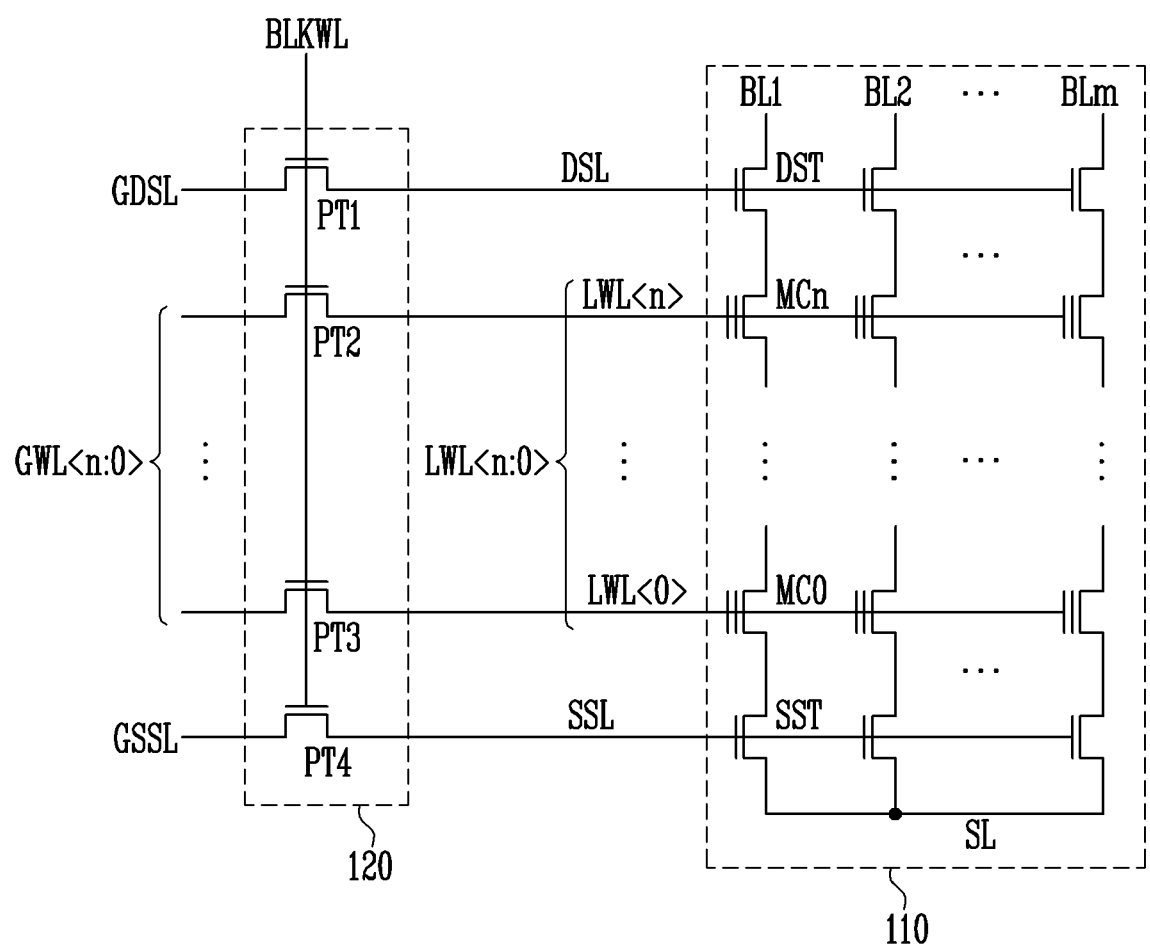
FIG. 2 is a circuit diagram illustrating a memory block and a pass circuit of FIG. 1, according to an embodiment of the present disclosure.

FIG. 2 is a circuit diagram illustrating the memory block and the pass circuit of FIG. 1, according to an embodiment of the present disclosure.

Referring to FIG. 2, the pass circuit 120 connects global word lines GDSL, GSSL, and GWL<n:0> and local word lines DSL, SSL, and LWL<n:0> of the memory block 110 in response to the block selection signal BLKWL output from the block decoder 140 of FIG. 1. The global word lines may include a global drain select line GDSL, a global source select line GSSL, and a plurality of global lines GWL<n:0>, and the local word lines may include a drain select line DSL, a source select line SSL, and a plurality of word lines LWL<n:0>. For example, the pass circuit 120 may connect the global drain select line GDSL and the global source select line GSSL to the drain select line DSL and the source select line SSL of the memory block 110, respectively, in response to the block selection signal BLKWL, and connect the plurality of global lines GWL<n:0> to the plurality of word lines LWL<n:0>, respectively. In addition, when the block selection signal BLKWL is deactivated to a logic low level, for example, a potential of 0V, the pass circuit 120 may electrically disconnect the plurality of global lines GWL<n:0> and the plurality of word lines LWL<n:0> to control the plurality of word lines LWL<n:0> to be in a floating state.

The pass circuit 120 may include a plurality of transistors PT1 to PT4, and the plurality of transistors PT1 to PT4 may be depletion transistors. For example, the transistor PT1 is connected between the global drain select line GDSL and the drain select line DSL in series. The transistor PT2 is connected between the global lines GWL<n> and the word line LWL<n> in series. The transistors PT1 to PT4 are turned on or off in response to the block selection signal BLKWL.

The memory block 110 includes a plurality of memory cells MC<n:0> connected to the plurality of word lines LWL<n:0>. In addition, the memory block 110 includes a drain select transistor DST connected to the drain select line DSL and a source select transistor SST connected to the source select line SSL. A plurality of source select transistors SST may share a source line SL. The drain select transistor DST, the plurality of memory cells MC<n:0>, and the source select transistor SST connected between one bit line (for example, BL1) among a plurality of bit lines BL1 to BLm and the source line SL may be defined as one memory string. That is, the memory block 110 may include a plurality of memory strings corresponding to the plurality of respective bit lines BL1 to BLm.

Although not shown in FIGS. 1 and 2, a page buffer may be connected to each of the plurality of bit lines BL1 to BLm. The page buffer may apply a program permission voltage or a program inhibition voltage to the plurality of bit lines BL1 to BLm during the program operation. In addition, the page buffer may read data by sensing a potential or a current amount of the plurality of bit lines BL1 to BLm during the read operation.

Figure 3:
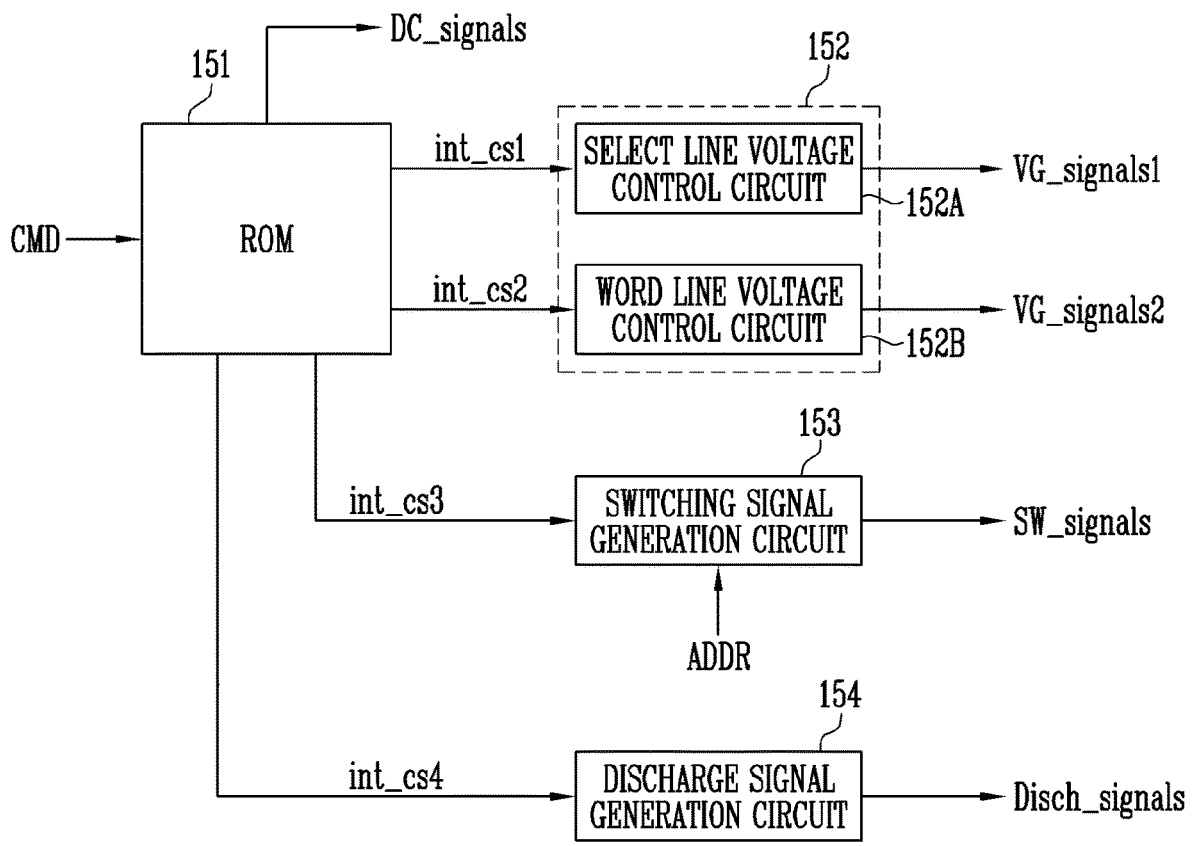
FIG. 3 is a block diagram illustrating a control logic of FIG. 2, according to an embodiment of the present disclosure.

FIG. 3 is a block diagram illustrating the control logic of FIG. 2, according to an embodiment of the present disclosure.

Referring to FIG. 3, the control logic 150 may include a ROM 151, a voltage generation control circuit 152, a switching signal generation circuit 153, and a discharge signal generation circuit 154.

The ROM 151 stores an algorithm for performing the overall operation of the semiconductor memory device. The ROM 151 generates and outputs first to fourth internal control signals int_cs1 to int_cs4 and the decoder signal DC_signals according to the algorithm stored therein and a command signal CMD input from the outside, for example, from a host connected to the semiconductor memory device.

The voltage generation control circuit 152 may include a select line voltage control circuit 152A and a word line voltage control circuit 152B.

In response to the first internal control signal int_cs1, the select line voltage control circuit 152A generates and outputs the first voltage generation control signals VG_signals1 for controlling the voltage generation circuit 131 of FIG. 1 to generate the operation voltage, for example, a turn-on voltage or a turn-off voltage to be applied to the drain select line and the source select line of the selected memory block.

In response to the second internal control signal int_cs2, the word line voltage control circuit 152B generates and outputs the second voltage generation control signals VG_signals2 for controlling the voltage generation circuit 131 of FIG. 1 to generate the operation voltage, for example, a program voltage, a read voltage, or a pass voltage to be applied to the word lines of the selected memory block.

In response to an address signal ADDR and the third internal control signal int_cs3, the switching signal generation circuit 153 generates and outputs the switching control signals SW_signals for controlling the global word line switch circuit 132 of FIG. 1 to switch the operation voltages, which are generated by the voltage generation circuit 131 and to be applied to the selected memory block, to the global word lines GWLs of FIG. 1.

In response to the fourth internal control signal int_cs4, the discharge signal generation circuit 154 generates and outputs the discharge signal Disch_signals for controlling the discharge circuit 133 of FIG. 1 to discharge the potential of the global word lines GWLs to the ground level, after the program operation or the read operation of the semiconductor memory device is completed and the local word lines LWLs of the memory block 110 are controlled to be in the floating state by the pass circuit 120 of FIG. 1.

Figure 4:
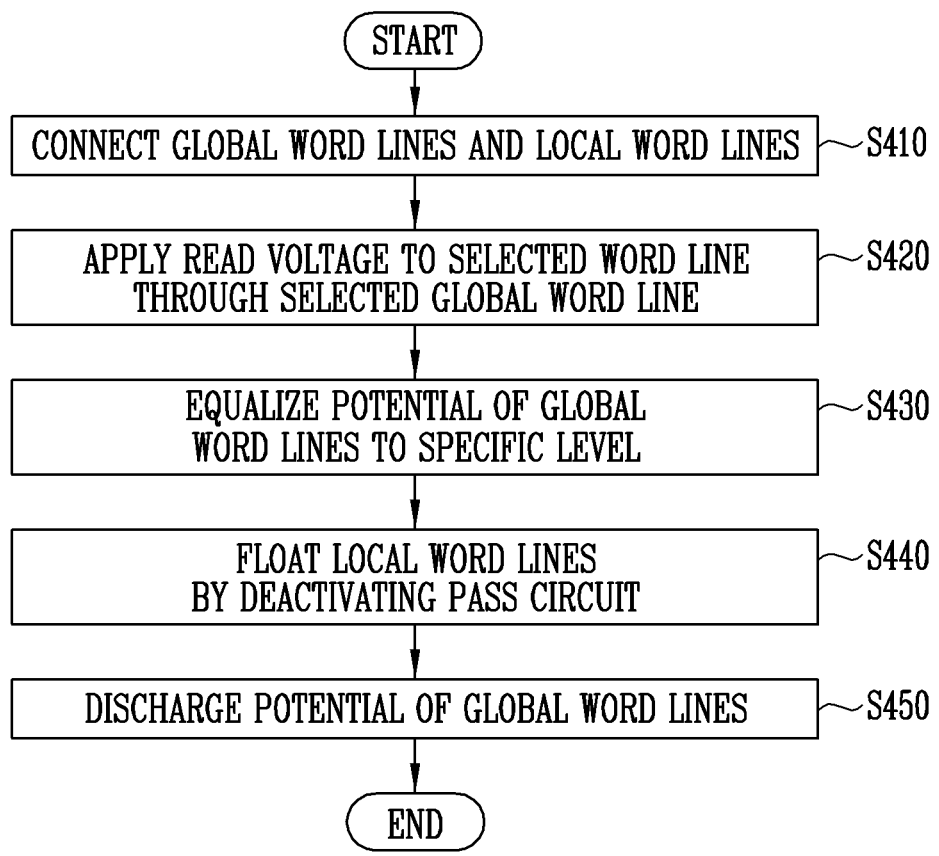
FIG. 4 is a flowchart illustrating a read operation of a semiconductor memory device according to an embodiment of the present disclosure.

FIG. 4 is a flowchart illustrating a read operation of a semiconductor memory device according to an embodiment of the present disclosure.

Figure 5:
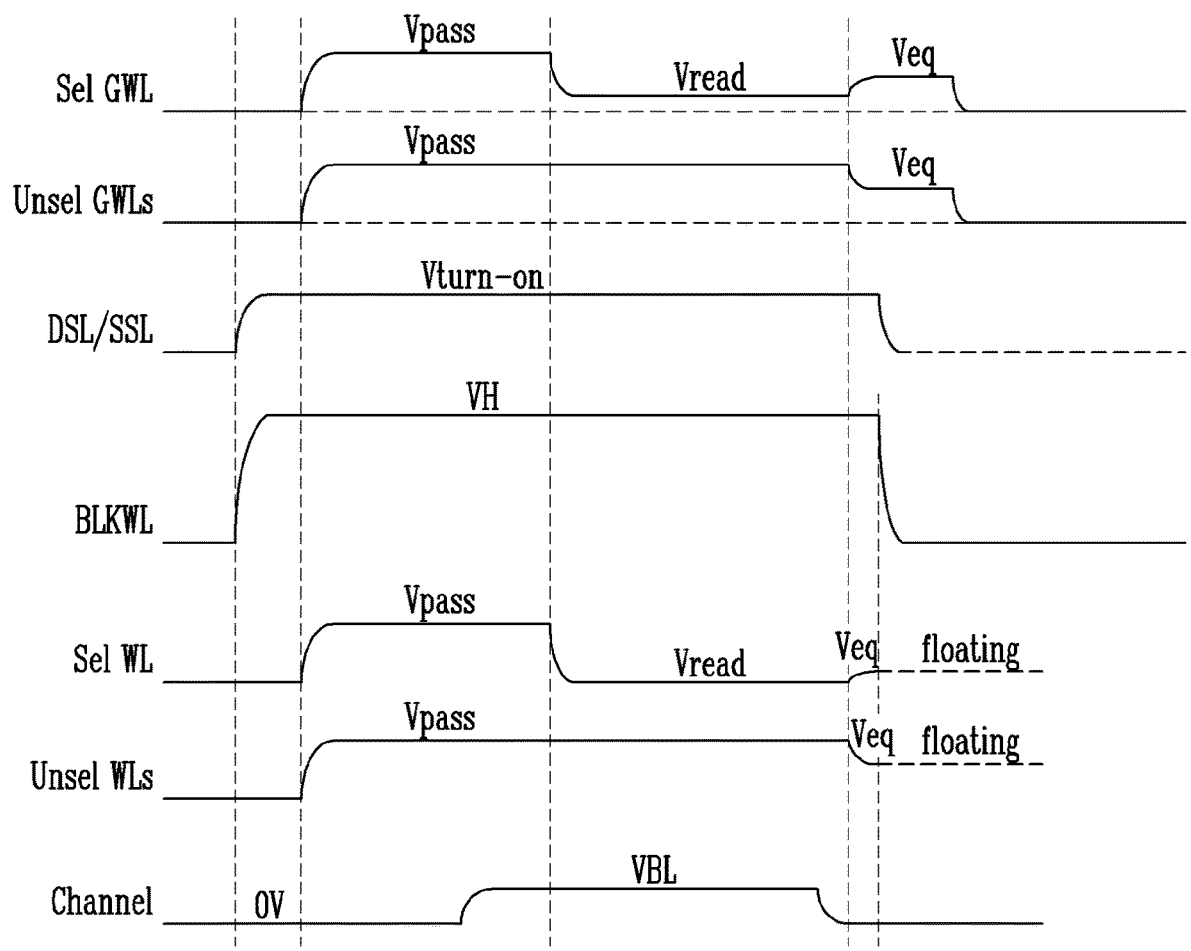
FIG. 5 is a waveform diagram of signals illustrating a read operation of a semiconductor memory device according to an embodiment of the present disclosure.

FIG. 5 is a waveform diagram of signals illustrating a read operation of a semiconductor memory device according to an embodiment of the present disclosure.

A method of operating a semiconductor memory device according to an embodiment of the present disclosure is described below with reference to FIGS. 1 to 5.

An embodiment of the present disclosure describes the read operation among the overall operations of the semiconductor memory device as an example.

In operation S410, the pass circuit 120 electrically connects the global word lines GWLs to the local word lines LWLs of the memory block 110 in response to the block selection signal BLKWL. For example, the block decoder 140 generates the block selection signal BLKWL having a high potential HV in response to the decoder control signal DC_signals. The pass circuit 120 electrically connects the global word lines GWLs to the local word lines LWLs in response to the block word line signal BLKWL. The voltage generation circuit 131 generates a turn-on voltage Vturn-on to be applied to the drain select line and the source select line among the local word lines LWLs of the selected memory block in response to the first control signals VG_signals1, the global word line switch circuit 132 transmits the turn-on voltage Vturn-on to global drain select line GDSL and the global source select line GSSL among the global word lines GWLs in response to the switching control signals SW_signals. Accordingly, the turn-on voltage Vturn-on is applied to the drain select line DSL and the source select line SSL of the memory block 110, and drain select transistors DST and the source select transistors SST of the memory block 110 are turned on.

Thereafter, the voltage generation circuit 131 generates a pass voltage Vpass in response to the second control signals VG_signals2, and the global word line switch circuit 132 applies the pass voltage Vpass to the global lines GWL<n:0> in response to the switching control signals SW_signals. Accordingly, the pass voltage Vpass is applied to the word lines LWL<n:0> of the memory block 110.

In operation S420, a bit line voltage VBL is applied to the plurality of bit lines BL1 to BLm, and thus each channel of the memory strings has a level of the bit line voltage VBL. A read voltage Vread is applied to the selected word line (for example, LWL<0>) of the memory block 110. For example, the voltage generation circuit 131 generates the read voltage Vread in response to the second control signals VG_signals2. The global word line switch circuit 132 applies the read voltage Vread to the selected global line (for example, GWL<0>) in response to the switching control signals SW_signals. Accordingly, the read voltage Vread is applied to the selected word line LWL<0> of the memory block 110.

In operation S430, when the read operation of the semiconductor memory device is completed, the voltage generation circuit 131 generates an equalizing voltage Veq in response to the second control signals VG_signals2. The global word line switch circuit 132 applies the equalizing voltage Veq to the global lines GWL<n:0> in response to the switching control signals SW_signals. Accordingly, a potential of the word lines LWL<n:0> of the memory block 110 are adjusted to a level of the equalizing voltage Veq. The equalizing voltage Veq may be a voltage having a potential lower than that of the pass voltage Vpass.

In operation S440, the pass circuit 120 is deactivated to control the local word lines of the memory block to be in the floating state. For example, the block decoder 140 deactivates the pass circuit 120 by discharging the block selection signal BLKWL having the high potential to 0V. Accordingly, the pass circuit 120 is deactivated to electrically disconnect the global word lines GWLs from the local word lines LWLs of the memory block 110. Accordingly, the word lines LWL<n:0> of the memory block 110 are controlled to be in the floating state. At this time, the drain select line DSL and the source select line SSL may be discharged to 0V which is a turn-off voltage.

In operation S450, after the word lines LWL<n:0> of the memory block 110 are controlled to be in the floating state, the discharge circuit 133 discharges the potential of the global word lines GWLs to the ground level in response to the discharge signal Disch_signals. At this time, since the word lines LWL<n:0> of the memory block 110 are controlled to be in the floating state, even though the potential of the global word lines GWLs is discharged to the ground level, a phenomenon, in which the channel of the plurality of memory strings of the memory block 110 is boosted to a negative potential level of 0V or less, is prevented.

Figure 6:
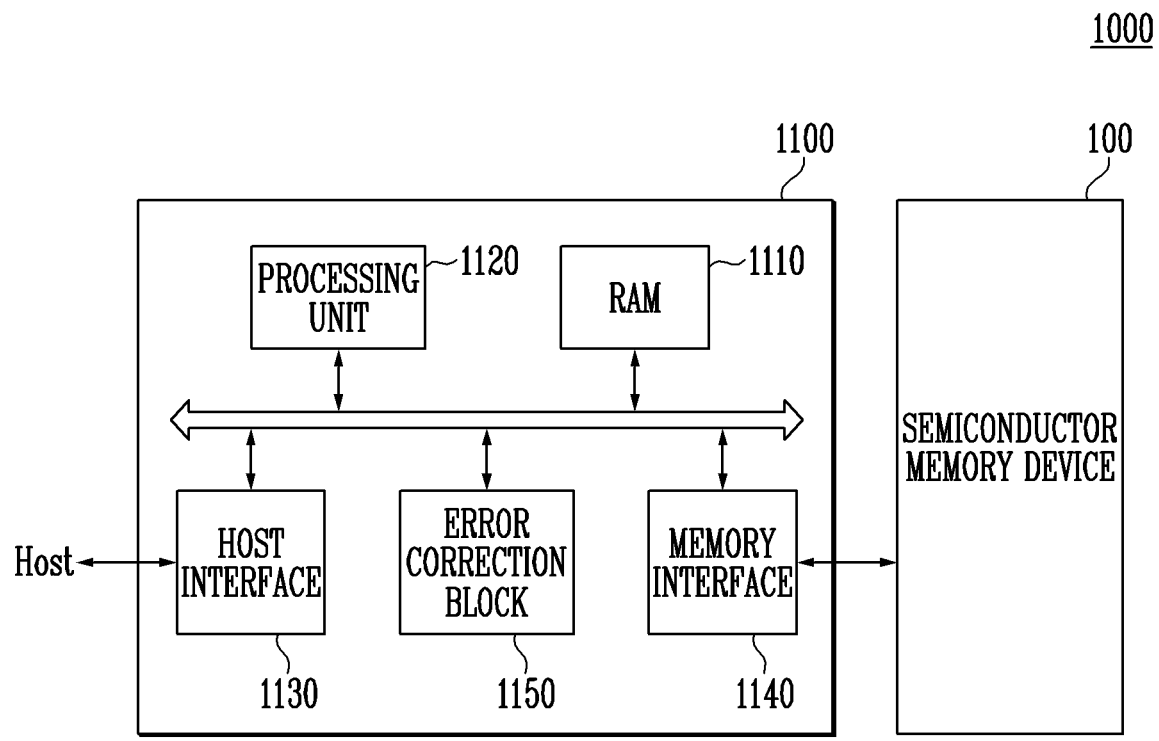
FIG. 6 is a block diagram illustrating a memory system including the semiconductor memory device of FIG. 1, according to an embodiment of the present disclosure.

FIG. 6 is a block diagram illustrating a memory system including the semiconductor memory device of FIG. 1, according to an embodiment of the present disclosure.

Referring to FIG. 6, the memory system 1000 includes the semiconductor memory device 100 and a controller 1100.

The semiconductor memory device 100 is the same as the semiconductor memory device described with reference to FIG. 1. Hereinafter, a repetitive description is omitted.

The controller 1100 is connected to a host Host and the semiconductor memory device 100. The controller 1100 is configured to access the semiconductor memory device 100 in response to a request from the host Host. For example, the controller 1100 is configured to control the read operation, the write operation, and a background operation of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls all operations of the controller 1100. In addition, the controller 1100 may temporarily store program data provided from the host Host during a write operation.

The host interface 1130 includes a protocol for performing data exchange between the host Host and the controller 1100. In an embodiment, the controller 1100 is configured to communicate with the host Host through at least one of various interface protocols such as a universal serial bus (USB) protocol, a multimedia card (MMC) protocol, a peripheral component interconnection (PCI) protocol, a peripheral component interconnect-express (PCI-express) protocol, an advanced technology attachment (ATA) protocol, a serial ATA (SATA) protocol, a parallel ATA (PATA) protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface includes a NAND interface or a NOR interface.

The error correction block 1150 is configured to detect and correct an error of data received from the semiconductor memory device 100 using an error correcting code (ECC). The processing unit 1120 will control the semiconductor memory device 100 to adjust a read voltage and perform the read operation again in accordance with an error detection result of the error correction block 1150. In an embodiment, the error correction block 1150 may be provided as a component of the controller 1100.

The controller 1100 and the semiconductor memory device 100 may be integrated into one semiconductor device. In an embodiment, the controller 1100 and the semiconductor memory device 100 may be integrated into one semiconductor device to form a memory card. For example, the controller 1100 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash memory (UFS).

The controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host Host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 100 or memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 7:
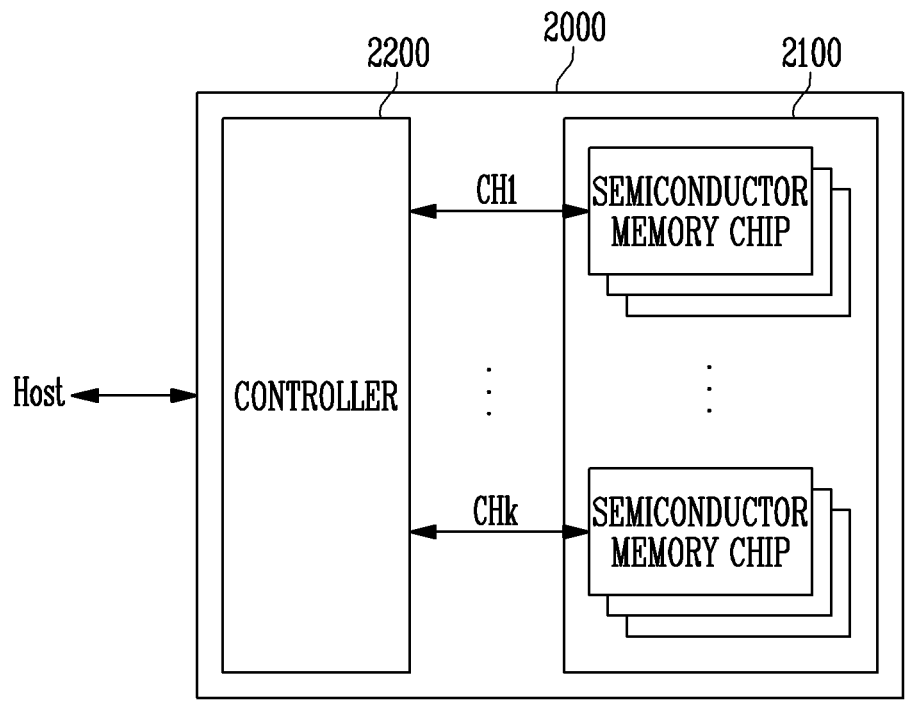
FIG. 7 is a block diagram illustrating an application example of the memory system of FIG. 6, according to an embodiment of the present disclosure.

FIG. 7 is a block diagram illustrating an application example of the memory system of FIG. 6, according to an embodiment of the present disclosure.

Referring to FIG. 7, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 7, the plurality of groups communicate with the controller 2200 through first to k-th channels CH1 to CHk, respectively. Each semiconductor memory chip may be configured and operated similarly to the semiconductor memory device described with reference to FIG. 1.

Each group is configured to communicate with the controller 2200 through one common channel. The controller 2200 is configured similarly to the controller 1100 described with reference to FIG. 6 and is configured to control the plurality of memory chips of the semiconductor memory device 2100 through the plurality of channels CH1 to CHk.

Figure 8:
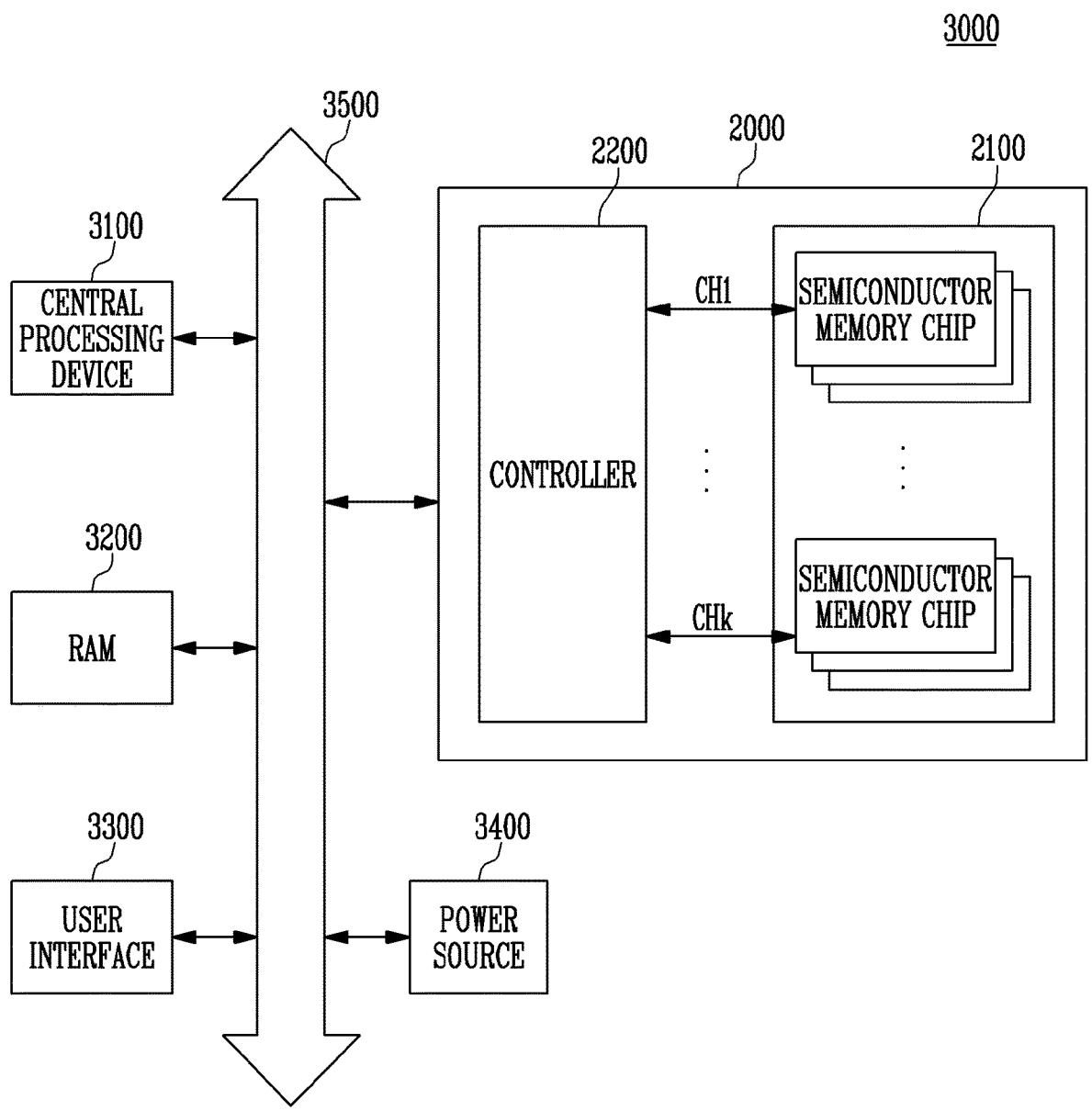
FIG. 8 is a block diagram illustrating a computing system including the memory system described with reference to FIG. 7, according to an embodiment of the present disclosure.

FIG. 8 is a block diagram illustrating a computing system including the memory system described with reference to FIG. 7, according to an embodiment of the present disclosure.

Referring to FIG. 8, the computing system 3000 includes a central processing unit 3100, a random access memory (RAM) 3200, a user interface 3300, a power source 3400, a system bus 3500, and the memory system 2000.

The memory system 2000 is electrically connected to the central processing unit 3100, the RAM 3200, the user interface 3300, and the power source 3400 through the system bus 3500. Data provided through the user interface 3300 or processed by the central processing unit 3100 is stored in the memory system 2000.

In FIG. 8, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing unit 3100 and the RAM 3200.

In FIG. 8, the memory system 2000 described with reference to FIG. 7 is provided. However, the memory system 2000 may be replaced with the memory system 1000 described with reference to FIG. 6. In an embodiment, the computing system 3000 may be configured to include both of the memory systems 1000 and 2000 described with reference to FIGS. 6 and 7.

Although the detailed description of the present disclosure describes specific embodiments, various changes are possible without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A semiconductor memory device comprising:
   a memory block including a plurality of memory cells connected to local word lines;
   a pass circuit including transistors configured to, in response to a block selection signal, connect or disconnect between the local word lines and global word lines; and
   a voltage providing circuit configured to apply an operation voltage of a program operation or a read operation to the global word lines while the transistors connect between the local word lines and the global word lines,
   wherein the transistors are configured to disconnect between the local word lines and the global word lines after the program operation or the read operation is completed, and
   wherein the voltage providing circuit is configured to discharge the global word lines while the transistors disconnect between the local word lines and the global word lines.

2. The semiconductor memory device of claim 1, further comprising a block decoder configured to:

generate the block selection signal of a high potential and output the block selection signal to the pass circuit during the program operation or the read operation on the memory block, and deactivate the block selection signal to a ground level before discharging the global word lines.

3. The semiconductor memory device of claim 1, wherein the voltage providing circuit comprises:

a voltage generation circuit configured to generate the operation voltage of the program operation or the read operation;

a global word line switch circuit configured to switch the operation voltage generated by the voltage generation circuit to the global word lines; and a discharge circuit configured to discharge the global word lines to a ground level.

4. The semiconductor memory device of claim 3, wherein the discharge circuit is configured to discharge the global word lines after the local word lines are in a floating state.

5. The semiconductor memory device of claim 1, further comprising a control logic configured to:

control a block decoder and the voltage providing circuit during the program operation or the read operation, output first control signals to control applying the operation voltage to the global word lines during the program operation or the read operation, and output second control signals to control the global word lines when the program operation or the read operation is completed.

6. The semiconductor memory device of claim 5, wherein the control logic comprises:

a ROM configured to store an overall operation algorithm, and output a plurality of internal control signals in response to a command received from an outside;

a voltage generation control circuit configured to generate the first control signals to control the voltage providing circuit in response to any of the plurality of internal control signals; and a discharge signal generation circuit configured to generate the second control signals to control a discharge circuit in response to any of the plurality of internal control signals.

7. A method of operating a semiconductor memory device, the method comprising:

connecting local word lines, which are connected to a plurality of memory cells included in a memory block to global word lines, by turning on transistors connected between the local word lines and the global word lines;

transferring an operation voltage to the local word lines connected to the global word lines, by applying the operation voltage to the global word lines;

disconnecting the local word lines from the global word lines, by turning off the transistors; and discharging the global word lines while the local word lines are disconnected from the global word lines.

8. The method of claim 7, further comprising:

adjusting the operation voltage applied to the global word lines to an equalizing voltage level before disconnecting the local word lines from the global word lines, after applying the operation voltage to the global word lines.

9. The method of claim 8, wherein the applying the operation voltage to the global word lines comprises:

applying a read voltage to a selected global word line among the global word lines; and applying a pass voltage to remaining unselected global word lines.

10. The method of claim 9, wherein the pass voltage has a potential higher than the equalizing voltage level.

11. A method of operating a semiconductor memory device including a memory block connected to local word lines and bit lines, the method comprising:

connecting the local word lines to global word lines;

applying a read voltage to a selected local word line among the local word lines through a selected global word line among the global word lines, and applying a pass voltage to unselected local word lines through unselected global word lines among the global word lines;

floating the local word lines by disconnecting the local word lines from the global word lines; and discharging the global word lines while the local word lines are disconnected from the global word lines.

12. The method of claim 11, further comprising:

adjusting the local word lines to an equalizing potential before floating the local word lines.

13. The method of claim 12, wherein the equalizing potential is lower than a potential of the pass voltage.

* * * * *